United States Patent
Richardson, Jr. et al.

(10) Patent No.: US 7,034,549 B2
(45) Date of Patent: Apr. 25, 2006

(54) DEVICE TO DETECT AND MEASURE THE CONCENTRATION AND CHARACTERIZATION OF AIRBORNE CONDUCTIVE OR DIELECTRIC PARTICLES

(75) Inventors: Robert E. Richardson, Jr., King George, VA (US); Arturo M. Lopez, White Plains, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/817,415

(22) Filed: Mar. 31, 2004

(65) Prior Publication Data

US 2005/0218909 A1  Oct. 6, 2005

(51) Int. Cl.
   *G01R 27/04* (2006.01)
   *G01F 13/00* (2006.01)
(52) U.S. Cl. .................... 324/636; 73/861.41
(58) Field of Classification Search ............... 324/636, 324/633, 629, 600, 631, 639, 640, 642, 647, 324/650, 204, 464, 459; 702/24; 73/627, 73/23.33, 863.31, 863.5, 628, 23.37, 28.01, 73/865.5, 861.41; 340/627, 628, 632
See application file for complete search history.

(56) References Cited

U.S. PATENT DOCUMENTS

| | | | | |
|---|---|---|---|---|
| 3,603,875 A | * | 9/1971 | Coulter et al. ............ | 324/71.1 |
| 3,845,480 A | | 10/1974 | Steinberg ................... | 340/236 |
| 3,952,246 A | | 4/1976 | Sprott et al. .............. | 324/58.5 |
| 4,015,464 A | * | 4/1977 | Miller et al. .............. | 73/61.75 |
| 4,042,879 A | | 8/1977 | Ho et al. .................... | 324/58.5 |
| 4,087,738 A | * | 5/1978 | Van Degrift et al. ....... | 324/322 |
| 4,580,441 A | | 4/1986 | Sakurai et al. ............. | 73/28 |
| 4,719,360 A | * | 1/1988 | Kontani et al. ............ | 250/574 |
| 4,904,928 A | | 2/1990 | Lewis ....................... | 324/636 |
| 4,926,120 A | | 5/1990 | Veronesi et al. ........... | 324/204 |
| 5,124,653 A | | 6/1992 | Andresen et al. .......... | 324/636 |
| 5,124,662 A | | 6/1992 | Downing et al. .......... | 324/636 |
| 5,156,776 A | * | 10/1992 | Loedding et al. ............ | 261/27 |
| 5,173,662 A | | 12/1992 | Trerice et al. ............. | 324/642 |
| 5,455,516 A | | 10/1995 | Jean et al. .................. | 324/639 |
| 5,642,193 A | * | 6/1997 | Girvin et al. .............. | 356/339 |
| 5,667,565 A | * | 9/1997 | Gondar ......................... | 96/60 |
| 5,729,470 A | | 3/1998 | Baier et al. ................. | 364/497 |
| 6,263,744 B1 | * | 7/2001 | Russell et al. ............. | 73/865.5 |
| 6,466,318 B1 | * | 10/2002 | Agrawal et al. ........... | 356/336 |
| 6,490,909 B1 | | 12/2002 | Boguszewski et al. ..... | 73/23.33 |
| 6,563,250 B1 | * | 5/2003 | Mathur ................... | 310/316.01 |
| 6,694,796 B1 | * | 2/2004 | Juneau et al. .............. | 73/1.03 |
| 6,931,950 B1 | * | 8/2005 | Malachowski et al. ..... | 73/865.5 |
| 2002/0003210 A1 | | 1/2002 | Marcus ....................... | 250/288 |
| 2003/0016357 A1 | * | 1/2003 | Shofner et al. ............. | 356/337 |

* cited by examiner

*Primary Examiner*—Anjan Deb
*Assistant Examiner*—Hoai-An D. Nguyen
(74) *Attorney, Agent, or Firm*—Gerhard W. Thielman, Esq.; Scott R. Boalick, Esq.; Matthew J. Bussan, Esq.

(57) ABSTRACT

A measuring system is disclosed which detects and measures the volume concentration and mass flow of the airborne conductive particles, such as carbon-absorptive chaff particles. The measuring system can be used to estimate the effective conductivity of the detected airborne conductive particles. Further, if particles are not airborne, but are lying on a surface they may be made to become airborne by the vacuum source of the present invention and then detected by the measuring system of the present invention.

22 Claims, 7 Drawing Sheets

DEVICE TO DETECT AND MEASURE THE CONCENTRATION AND CHARACTERIZATION OF AIRBORNE CONDUCTIVE OR DIELECTRIC PARTICLES

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

The present invention relates to a measuring system, and more specifically, to a system for detecting and measuring the volume concentration and effective conductivity of airborne conductive particles such as (typically ¼ inch-long) mm-wave carbon-fiber absorptive chaff elements.

(2) Description of the Prior Art

Prior art techniques for detecting and/or classifying airborne absorptive chaff particles typically involve measuring scattered light from the particles, passing particles through a grid and measuring possible electrical contact between particles and grid elements or collecting particles on a filter for a specified time and then weighing the filter to determine the mass of the collected material. These techniques are cumbersome to apply however, and also do not quantitatively measure the effective conductivity of the particles. Effective electrical conductivity of particles may be estimated by examining particles under a microscope and physically performing electrical measurements, but these techniques are also cumbersome, very time consuming and labor intensive to apply. It is desired to provide a system for detecting and/or classifying airborne absorptive chaff particles without suffering the prior drawbacks of weighing the filter to determine the mass of the collected airborne particles without performing any microscope analysis of the collected particles, while at the same time, providing for a measurement of effective conductivity of the particles.

SUMMARY OF THE INVENTION

It is a primary object of the present invention to provide a system for detecting and classifying airborne absorptive chaff particles and which is devoid of any weighing process or any microscope analysis.

It is a further object of the present invention to provide for a system for detecting and classifying particles and to measure the effective electrical conductivity.

It is a further object of the present invention to provide for a system for measuring the volume of airborne collected particles being detected and classified.

It is a further object of the present invention to measure the mass flow rate of the airborne collected particles being measured and detected.

It is a further object of the present invention to provide for a system for providing a display of a histogram of the effective conductivity of the airborne particles being measured and detected.

The device for detecting airborne conductive or dielectric particles comprises: a resonant cavity having a high E-field sensing region; means for feeding power to the cavity; means for directing airborne particles through the high E-field sensing region of the cavity; and sensing means coupled to the cavity for sensing the drop in E-field level caused by the particle and outputting a signal representative thereof.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numbers refer to like parts and in which:

DETAILED DESCRIPTION OF THE PREFERRED EMBODIMENTS

Figure 1:
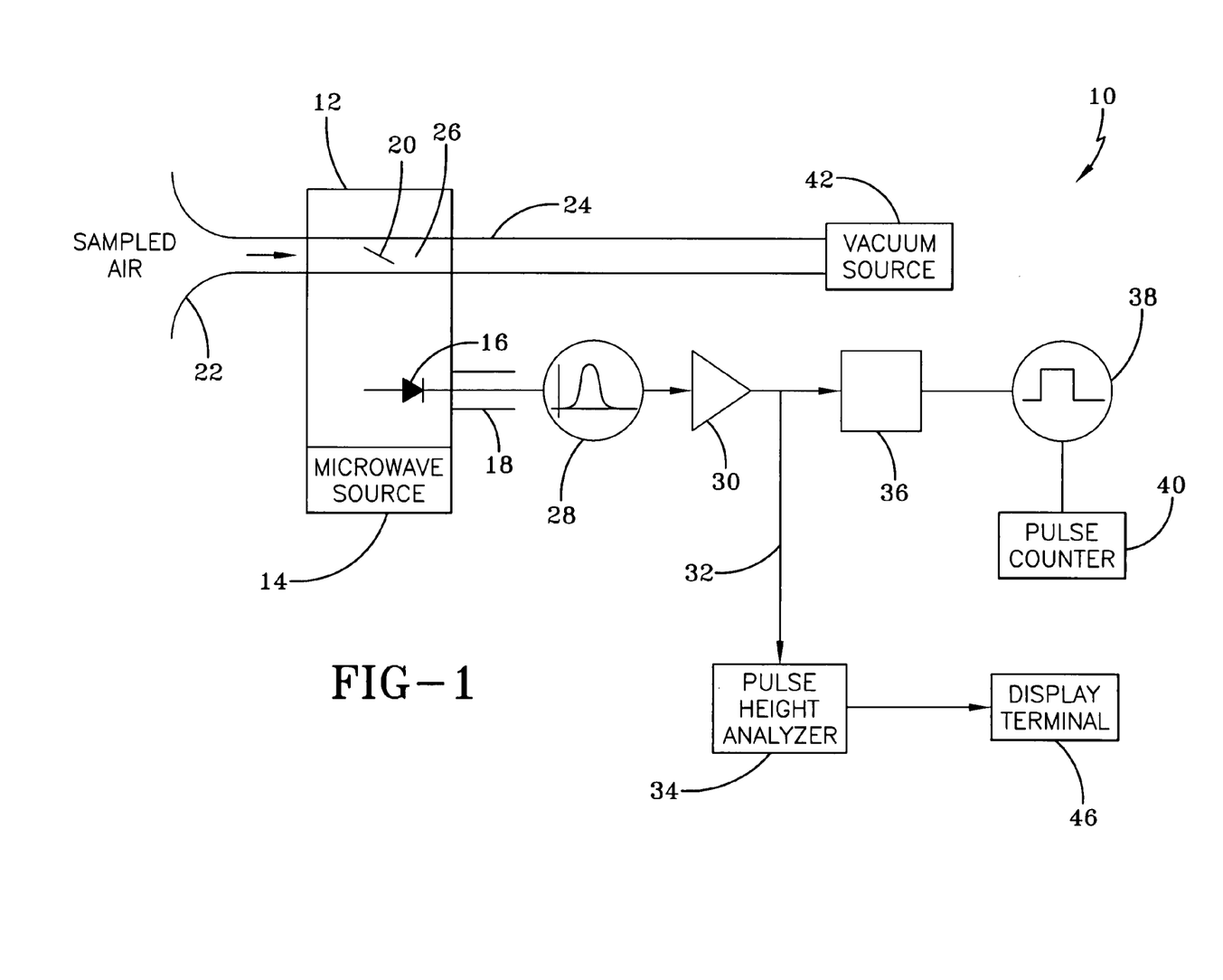
FIG. 1 is a block diagram of the device 10 of the present invention for detecting and measuring properties of airborne conductive particles.

FIG. 1 shows a block diagram of a device 10 that detects and measures the volume concentration and effective conductivity of airborne conductive particles, such as (typically ¼"-long) mm-wave carbon-fiber absorptive chaff elements.

As shown in FIG. 1, the device 10 comprises a microwave cavity 12 fed by a low power microwave source 14, typically a low power Gunn effect oscillator, with the fields of the cavity being sensed by a simple crystal diode mixer or crystal detector 16. Airborne fibers 20 enter through the sampling nozzle 22 and pass through a small dielectric flow tube 24 through a high E-field sensing region 26 in the cavity 12 where the fibers 20 perturb the cavity resonance properties by interaction with the cavity E-field. For conductive particles 20, passage of the particle 20 through the sensing region 26 absorbs energy from the field (reducing the cavity Q) and decreasing the detected E-field level in the cavity 12. This produces a small output pulse 28 from the detector 16, which is amplified by amplifier 30, that provides an analog output on signal path 32 and which is delivered to a pulse height analyzer 34, and also fed to a discriminator/comparator circuit 36, which produces a logic pulse 38 that may be counted by a digital pulse counter circuit 40. In this mode, the device 10 serves as a particle detector and counter circuit 40. By knowing the air volume flow rate through the flow tube 24 and counting the number of pulses per unit time, the device 10 can be used to determine the volume concentration of particles in the samples inlet air. The airborne particles 20 are drawn through the sensing cavity by a vacuum source 42. Further details of the microwave source and microwave waveguides, may be further described with reference to FIG. 2.

Figure 2:
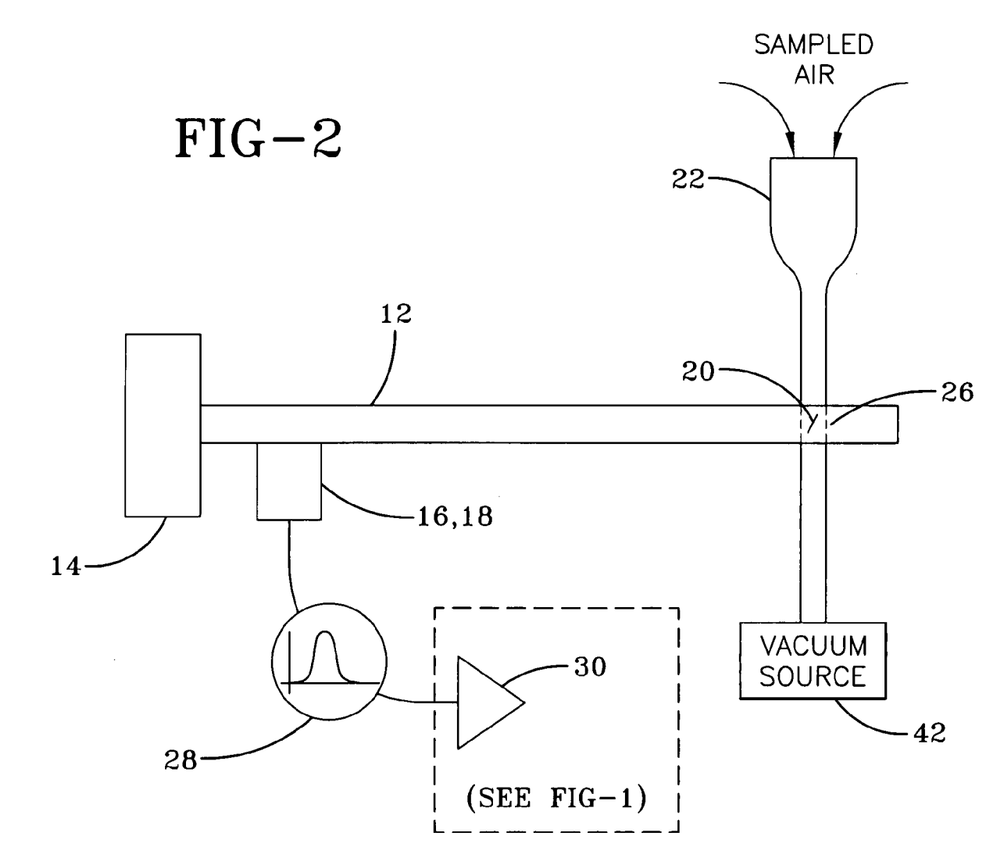
FIG. 2 illustrates further details of the waveguide arrangement associated with the device of FIG. 1.

FIG. 2 illustrates that the cavity 12 of FIG. 1, which in actuality is only a part of the overall microwave waveguide 12. Further, FIG. 2 more clearly illustrates the interconnection of the vacuum source 42 for drawing the particle 20 through the cavity region 26. The mode of operation of the microwave waveguide 12 is more clearly shown in FIG. 3.

Figure 3:
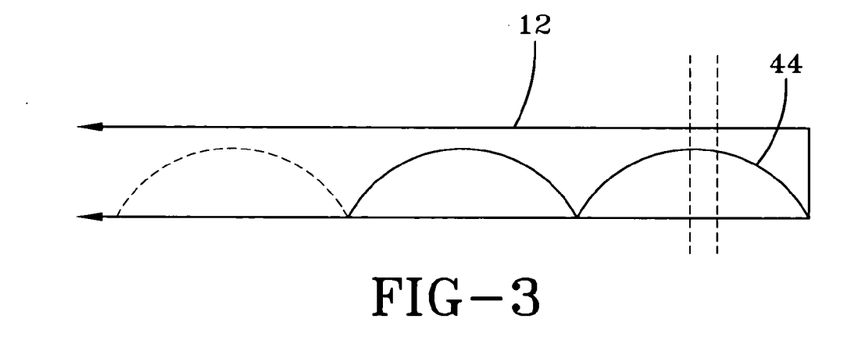
FIG. 3 illustrates a TE (0 1 m) standing wave pattern present in the waveguide cavity of FIG. 2.

FIG. 3 shows the waveguide 12 as operating in the transfer select mode TE (0 1 m). FIG. 3 further shows a standing wave pattern 44 within the microwave waveguide 12.

The device 10 of FIG. 1 may be used to determine the effective conductivity or the mass of the transiting particles 20. For thin fibrous chaff particles 20, often several fibers stick together in a cordwood fashion. In this case, the effective conductivity of a particle is proportional to its mass. By proper cavity design, to be discussed hereinafter, the output pulse height of the output pulse 28 from the detector 16, may be made to be (nearly) linearly dependent on the effective conductivity of the particle 20. The m value of a TE (01 m) cavity mode as shown in FIG. 3 is chosen based on measurement requirements and depends on the size, conductivity or dielectric constant of the particles. The value for m could be as small as 1 or possibly in excess of 30.

If desired, and in conformance with the microwave leakage parameters to be further described hereinafter with reference to FIG. 5, the length of the cavity may be made large compared to particle length to accommodate the E-field interaction and Q reduction of the cavity itself. In this case, the pulse height of pulse 28 from the detector 16 can be made to vary nearly linearly with effective fiber conductivity. For some types of particles, this effective conductivity is proportional to the number of fibers stuck together in a given particle or to the particle mass. For this case, the time average value of the analog output voltage on signal path 32 from the amplifier 30 in FIG. 1 is proportional to mass flow rate.

The analog output signal from the amplifier 30 is preferably fed to the pulse height analyzer 34, which comprises an analog to digital converter and memory circuitry. The pulse height analyzer 34 determines the height of each individual pulse and stores a count in a memory storage register, which has an address number proportional to the pulse height. The result is a histogram-like display of the effective conductivity of the transiting particles, which may be viewed on display terminal 46.

Depending upon the sophistication of the processing circuitry chosen for FIG. 1, the electronic output from the device 10 may be: (i) proportional to the number of particles 20 above a certain size, passing through the sensing region 26, (ii) proportional to the amount of mass per unit time passing through the sensing region 26, or (iii) representative of a histogram of particle effective conductivity which for some types of particles is proportional to their size or mass (effective conductivity proportional to number of fibers per particle) distribution.

Further details of the microwave waveguide 12, and in particular, the wavelengths within the microwave waveguide 12, may be further described with reference to FIG. 4. The waveguide 12 is selected to be approximately an integral number of half (guide) wavelengths $\lambda_g$ in length at the operating frequency. The presence of the detector diode 16 and the flow tube 24 in the cavity 12 changes the resonant length of waveguide 12 somewhat. In one embodiment, waveguide 12 had cavity dimensions of 1.5" length, 0.9" width and 0.40" height for an operation at a frequency of about 10 GHz. The microwave source 14 is operated at a frequency slightly above the resonant frequency of the cavity. This insures that the energy sampled by the detector diode 16 is reduced when a particle 20 transits the measurement interaction space, that is, sensing region 26, either because the particle reduces the Q of the cavity or because it lowers the resonant frequency of the cavity. Either case produces the same polarity of pulse from the detector diode 16. The flow tube 24 is placed a quarter wavelength from the end of the cavity so that the particles 20 will pass through a region, serving as sensing region 26, of maximum E-field thereby maximizing its interaction with the field.

Also for maximum interaction the cavity volume which is related to value for m (the number of maximas in the standing wave pattern 44 of fields in the waveguide 12) should be as small as possible. The waveguide 12 shown in FIG. 4 uses m 2. To reduce the transit time and sharpen the pulse 28, the cavity 12 may be designed so that the sensor region 26 occurs in reduced height guide, thus reducing the length of the sensing region 26. This is shown in FIG. 5. The height and length of the reduced height section 48 is 0.25" and 0.75". The height and length of the impedance matching transition are 0.316" and 0.375".

Figure 5:
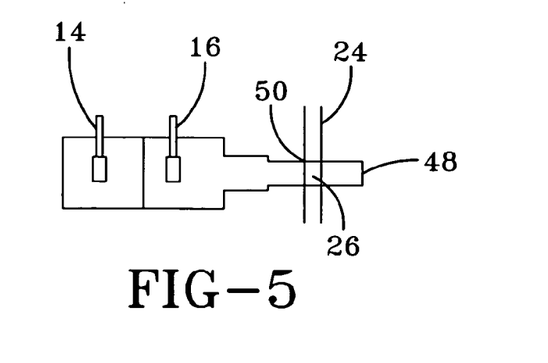

The flow tube 24 from the sampling port 50, shown in FIG. 5, is made to have a small diameter, such as less than ¼ inch diameter for ¼ inch particles and operation at approximately 10 GHz near the sensing region 26 for several reasons. First, if the airflow rate (velocity) is high, the particle 20 stays in the sensing region 26 only very briefly and the detector output pulse 28 from transit of the particle will be short which is desirable. More importantly, the particle in the form of a fiber 20 is constrained to be aligned with the axis of the flow tube 24 and thus, will be forced to be aligned with the cavity E-field, which means that a particle 20 of a given conductivity and length will always yield the same cavity perturbation as it passes through. The flow tube 24 should have a small (in comparison with wavelength at the operating frequency) diameter also so that the cavity fields will not extend down the flow tube 24 very far from the waveguide sensing region 26, because of waveguide-below-cutoff effect (in the flow tube). This helps to keep the unperturbed cavity Q high by not allowing microwave energy to leak down the tube. Also, since this sharply defines the sensing region 26, the detector output pulse 28 is kept short with sharply defined leading and trailing edges. Except for these considerations, the flow in the flow tube 24 is not critical. It is preferred that the flow tube 24 have a dielectric lining as it passes through the sensing region 26. There is no requirement for a particular Reynolds number for proper operation. Measurements have been done in prototype devices where the air velocity in the flow tube as measured with time of flight techniques was varied from less than 100 ft/sec to over 300 ft/sec with good results.

The field-particle interaction in sensing region 26 may be described for the situation of that as a particle 20 passes through the sensing region 26 in the cavity of the waveguide 12, it absorbs microwave power reducing the cavity Q.

As is known in the art, cavity Q is defined as:

$$Q = \frac{\omega \cdot W}{Pd}$$

where W is the stored energy given by $\in E^2$ over the volume of the chamber, ω is the frequency and Pd is the dissipated power. Power is dissipated in the cavity walls, at the feed point and E field sample point, and in a particle 20 having the form of a particle passing through the cavity sensing region 26. The output pulse 28 from a detected fiber is derived from the decrease in E field due to the decreased Q.

A pulse may also be obtained from a dielectric or magnetically active particle with no conductivity because the presence of the particle in the cavity will alter the cavity resonant frequency.

As is known in the art, a non-conductive dielectric particle with relative dielectric constant $\in$ reduces the resonant frequency F of a cavity according to a relation of the form:

$$\frac{\Delta F}{F} = \frac{k(\varepsilon - 1) \int_{Vparticle} E^2 dv}{W_E}$$

where k is a constant depending on geometry factors and $W_E$ is the electric energy in the cavity. The presence of the particle in the cavity in a region where it interacts with the electric field E in the cavity reduces the cavity resonant frequency. If the cavity is excited at a frequency above its natural resonant frequency, then the transit of the particle through the cavity reduces the power detected by the crystal detector 16 because the cavity is excited further off resonance during particle transit. A similar response could be obtained if a magnetically active particle were placed in a region of the cavity where it could interact with the magnetic field.

Sensitivity of the microwave interaction to dielectric, magnetically active or conductive particles is proportional to the ratio of particle volume to cavity volume.

For maximum sensitivity to conductive particles, the power dissipated in a particle 20 as it passes through the sensing region 26 should be a large fraction of the total dissipated power in the cavity. This can be done by minimizing all other losses, and requiring that the fiber 20 have maximum interaction with the cavity E field. Thus for maximum sensitivity, the cavity can be made to resonate in a $TE_{011}$ mode. Power $P_d$ dissipated in a particle is proportional to geometry factors, the square of the E field, the volume of the particle and the bulk conductivity of the fiber material 20. The field internal to a long fiber aligned with external field is nearly equal to the external field. The Power, $P_d$, may be expressed as:

$$P_d = \int_{Vparticle} \sigma \cdot E^2 \cdot dv$$

For one case, a ¼ inch long, 7 micrometer diameter, 500 Mho/cm fiber limits the cavity Q to about 10, whereas the Q limit due to wall and probe losses alone is on the order of 1000. This is a very large perturbation yielding high sensitivity to individual particles.

In the maximum sensitivity described above, a single fiber particle 20 reduces cavity Q a very large amount. A single fiber particle 20 spoils the Q so much that the cavity barely resonates. In order to use the device 10 to classify particles according to their conductivity, it is desirable to have an approximately linear response, i.e., a two-fiber particle should yield approximately twice the output pulse height as a single fiber particle. This kind of response can be obtained by using a different choice of cavity design such that the fiber dissipation is a small percentage of the total dissipated power. By using a long slender TE01 m mode cavity (with large approximately 10) value for m, the cavity perturbation by a single particle in a maximum E location is reduced. In this way, a single fiber particle 20 can be made to reduce cavity Q by say 10%, a double fiber particle 20 and additional 10% of the new Q or a total of nearly 20% and so on. This linearity can not be maintained indefinitely because of diminishing returns in the percentage of Q change and also because of skin depth effects in particles consisting of many fibers, however, for particles 20 consisting of a few fibers an approximately linear response occurs. The particle 20 volume is proportional to the number of fibers which is proportional to the particle mass. Thus, the device 10 is either a particle detector if it is operated in the high sensitivity mode which is nearly Q spoiled by a single fiber, or a mass detector if it is operated in a reduced sensitivity "linear" mode.

A single pulse 28 is produced by the detector 16 for each particle. The concentration of particles is calculated by an equation of the form:

$$\text{Concentration } (\#/m^3) = \frac{\text{Particle Counts/sec}}{\text{VolumeFlow Rate } (m^3/\text{sec})} \quad (1)$$

Volume flow rate is a function suction level produced by vacuum source 42 at the output of the flow tube 24. Nominal flow rate vs. vacuum suction level for a ¼ inch diameter flow tube may be further described with reference to FIG. 6.

Figure 6:
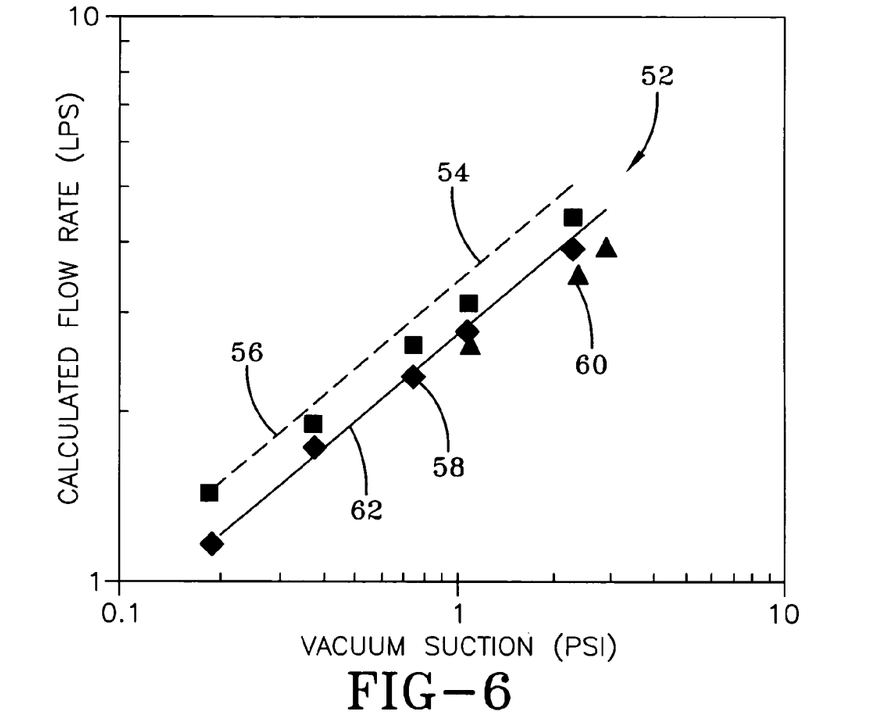
FIG. 6 shows curves related to normal flow vs. vacuum suction used in the device 10 of FIG. 1.

FIG. 6 shows a family of curves 52 comprised of 56, 58, 60, and 62 curves for different settings of vacuum suction (psi), given as the x axis of FIG. 6, and the calculated flow rate (1 ps) given as the y axis of FIG. 6.

FIG. 6 shows calculated flow rates derived from time-of-flight measurements (curves 56, 58, 60, and 62) for different vacuum levels. The results of FIG. 6 indicate that the flow rate vs. vacuum and curves thereof are not particularly sensitive to the positive clean-air pressure used in the practice of the present invention.

The flow rate data shown in FIG. 6 was determined from experiments using a detector operator with two cavities 12 positioned 4.2" apart along the flow tube 24 to perform time of flight measurements. The flow velocity was calculated by determining the time of flight of particles passed along the inlet flow tube 24. The data of FIG. 6 was taken for two different experiments. Time of flight data is statistical with about a 20% spread. The peak values were calculated by minimum time-of-flight at a particular vacuum level and the average value is the mean velocity for the series in about 40 data points at each vacuum level. The velocity data determined from these time-flight-measurements fall slightly below that calculated from the Bernouli equation (curve 54). Volume flow rates in liters per second was calculated by applying the velocity over the entire ¼-inch flow tube 24 inner diameter. This calculation assumes the particles travel at the same velocity as the airflow and that the velocity is uniform across the tube diameter and which is approximately true for high Reynolds number turbulent flow.

If desired, (and if consistent with microwave leakage requirements in a manner as previously described with reference to FIG. 5) the flow tube diameter may be made large compared with the particle length to accommodate high volume flow rates for sampling requirements. For such a high flow rate arrangement, the particles 20 may not align with the axis of the flow tube 24. To accommodate the desired alignment, the arrangement 64 shown in FIG. 7 may be utilized.

Figure 4:
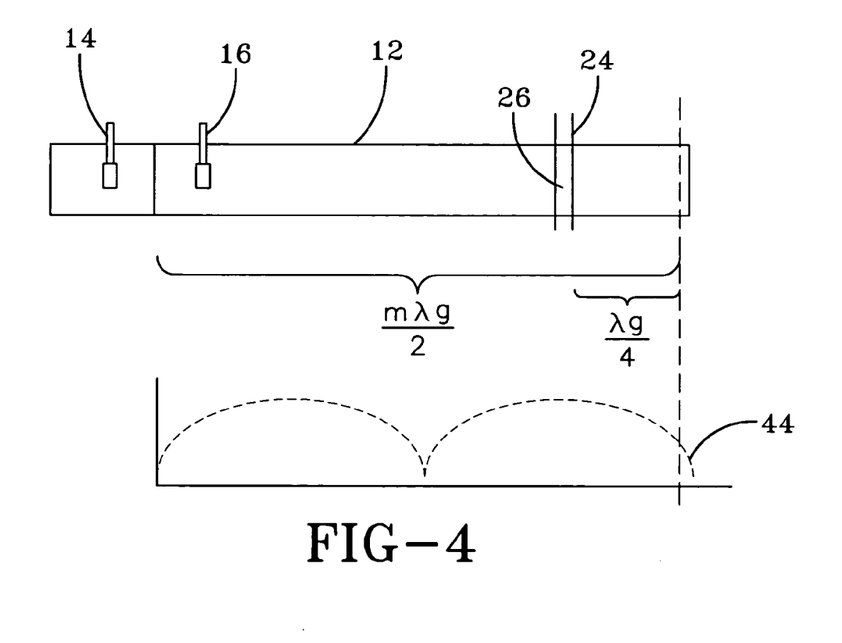
FIGS. 4 and 5 illustrate further details of the waveguide arrangement shown in FIG. 1.
Figure 7:
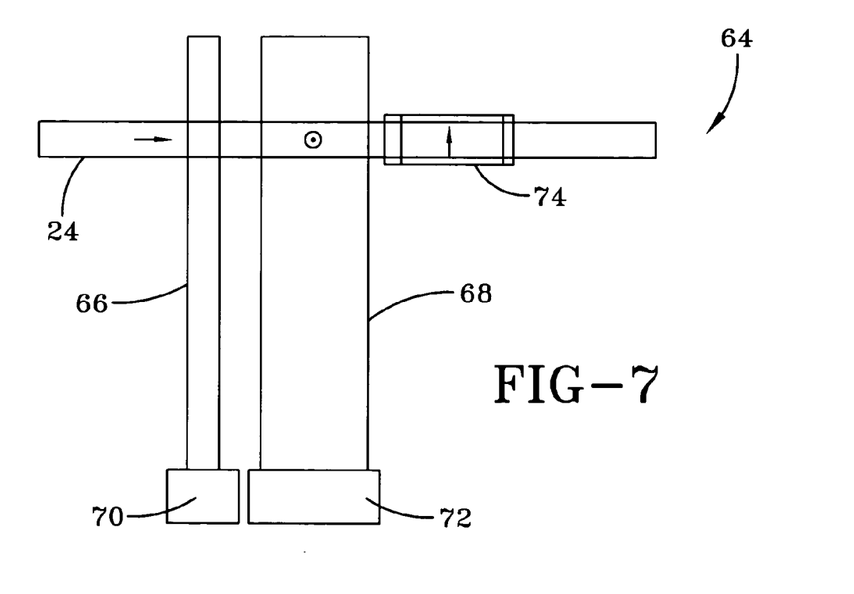
FIG. 7 illustrates an arrangement of waveguides to measure the three components of airborne particles.

The arrangement 64 comprises the flow tube 24, and two (2) additional waveguides 66 and 68 and cavity devices 70, 72, and 74, respectively mounted on one end of waveguide 66, one end of waveguide 68, and the central region of the flow tube 24 with the arrangements of all as shown in FIG. 4.

The three cavity devices 70, 72, and 74 are arranged with orthogonal E-field direction to measure three components of the alignment of the particle 20. More particularly, the three cavity sensors 70, 72, and 74 are mounted orthogonally to sense (consecutively) three components (x, y and z axis) of the particle interaction within the cavity sensors 70, 72, and 74. The three interaction components sense and define the particle orientation and in a large flow tube the particle orientation is random. The particle should be aligned with the E field to get an interaction and get counted by the practice of the present invention. If the particle is perpendicular to the E field in one of the cavities, then at least one of the other cavities will detect it. The configuration shown in FIG. 7 requires only that the particles do not tumble significantly while traveling down the flow tube 24 through the three sensors 70, 72, and 74.

Figure 8:
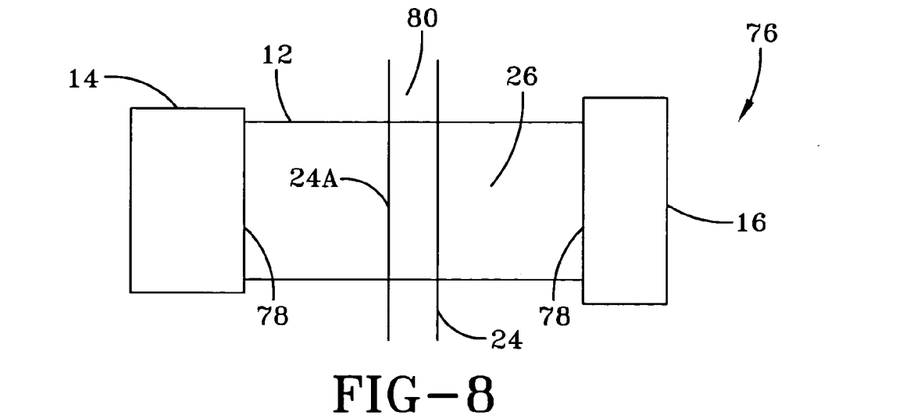
FIG. 8 illustrates the transmission mode cavity related to the present invention.

The transmission flow cavity for the measurement of conductivity of the particles 20, may be further described with reference to FIG. 8 showing an arrangement 76. The arrangement 76 shows further details of the interconnection of the microwave source 14, the detector 16, the microwave waveguide 12, and the flow tube 24 preferably having a dielectric portion 24A as it passes through the sensing region 26. The microwave waveguide 12 and the detector 16 further have coupling Iris 78, whereas the particle flow through the flow tube 24 is shown by directional arrow 80.

The detecting cavities may be operated in transmission mode (known in the art) where microwave or mm-wave power transmitted through the waveguide 12, in particular, is primarily focussed in the sensing region 26 of the waveguide 12.

Particles 20 drawn down the flow tube 24 occasionally stick to the flow tube 24 inner wall and reduce the sensitivity of the detector 16. This can be problematic, if the detector 16 comprised of the system 10 operates for a relatively long period of time in a region of high particle concentration. This problem may be substantially eliminated by the arrangement 82 shown in FIG. 9.

Figure 9:
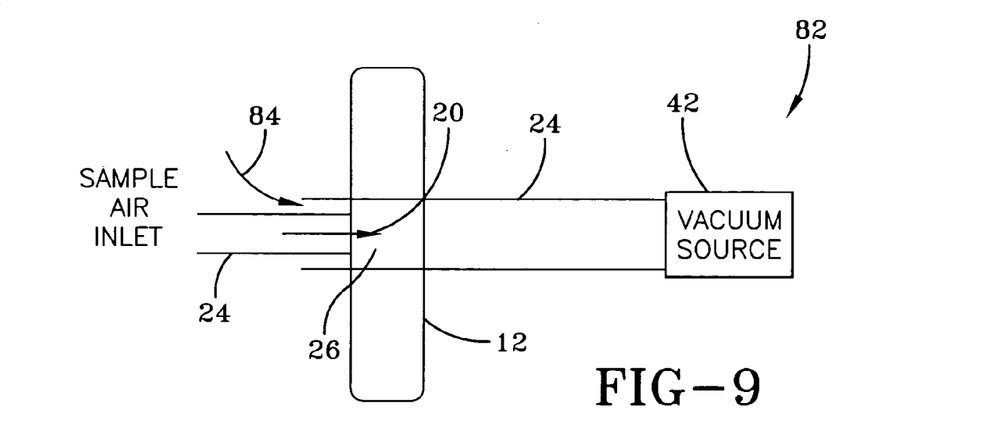
FIG. 9 illustrates a waveguide arrangement that reduces the deposition of particles in the cavity sensing region.

The arrangement 82 provides for a clean-air bounded layer for preferably clean air and is drawn into the sensing region 26. The sensing region 26 forms a boundary layer along the inner side of the flow tube 24, which reduces the deposition of particles in a cavity sensing region 26 and allows the detector 16 to operate for longer periods of time in a high concentration without contamination thereof. A further reduction to minimize the probability of particles sticking to the flow tube 24 in sensing region 26, may be further described with reference to FIG. 10 showing an arrangement 86.

Figure 10:
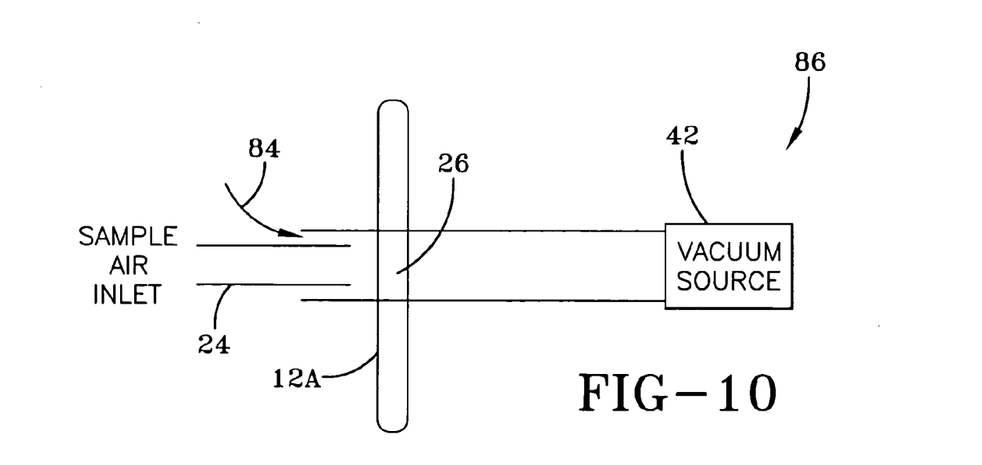
FIG. 10 illustrates a second waveguide arrangement that reduces the deposition of particles in the cavity-sensing region.

The arrangement 86 of FIG. 10 is similar to the arrangement 82 of FIG. 9 with the difference therebetween being that the arrangement 86 has a reduced height sensing region 26. This minimizes the probability of particles drawn through the flow tube 24 and into cavity sensing region 26 sticking therein by reducing the particle transition time.

Air pressures may be sensed along various points in the flow tube 24 and at the clear inlet region 84 to verify their correctness for desired flow rates in the flow tube 24. If the pressure levels were outside a desired range indicating possible clogging, or rather incorrect flow conditions, a high pressured air stream may be connected to the clean-air inlet 22 of FIG. 1 or the sampled air inlet of FIG. 10 by a solenoid operated valve so as to cause a so-called sneezing condition to unclog the flow tube 24.

In certain applications of the device 10, it is desired to have confidence that the device is working correctly as it is intended to work. Correct flow rates may be monitored by monitoring pressures along the flow tube 24 and periodically verifying correct operation by monitoring the sensing of the dc bias level from the crystal detector 16. The bias level is typically in the order of several volts and decreases in magnitude by few mV when a conductive particle 20 transit the measured space. If the bias level falls below this level, it is an indication that the microwave source 14 is not providing a suitable power level to the cavity or some other malfunction has occurred.

In operation, the detector 16 of FIG. 1 positively senses conductive particles 20, via a low-power microwave (E-field) interaction as they pass through a flow tube 24. The voltages and currents induced in the particle are so low that there should be no hazard around flammable or explosive atmospheres. Individual particles 20 are detected. The flow rates may be made high so that the detector 16 is sensitive to low concentrations of airborne particles.

Additionally a major feature of the device 10 is its ability to classify particles 20 according to their effective conductivity thereby providing a rapid means of profiling or histogramming an aerosol distribution. It is desirable to profile an aerosol distribution in dissemination studies to determine what percentage of the particles disseminate as single fibers. In the past it has been extremely difficult to provide such data because of laborious effort required in viewing a significant number of particles collected from the cloud under a microscope. As a result, this type of data was simply not taken in most dissemination and smoke tests. It was simply assumed in smoke tests that most particles consisted of single fibers. Quantitative radar measurements of attenuation and scattering on aerosolized clouds, however, indicate that a significant number of particles disseminate as multiple fiber entities. The device 10 of the present invention is capable of determining how many fibers are in each particle from a rapid conductivity measurement on individual particles as they pass through the sensing region 26 of a small resonant millimeter-wave cavity 12. Availability of this kind of data would provide independent data for confirmation of current microwave field-particle interaction models.

Alternatively, if diagnostic particle classification is not required the device 16 may be used simply as a particle detector, yielding a single count for each particle above a certain size, which passes through the sensing region 26. A particle detector 10 of this type would have wide applicability for monitoring purposes to detect the presence of obscurant CF clouds in combat condition or in certain regions of a test laboratory. It can be used as an area monitor or as a contamination indicator. To check for the presence of conductive particles on clothing or other materials, the inlet end of the sampling tube is placed near the surface to be monitored and the material is "vacuumed" through the flow tube 24 to the detector 16.

Figure 11:
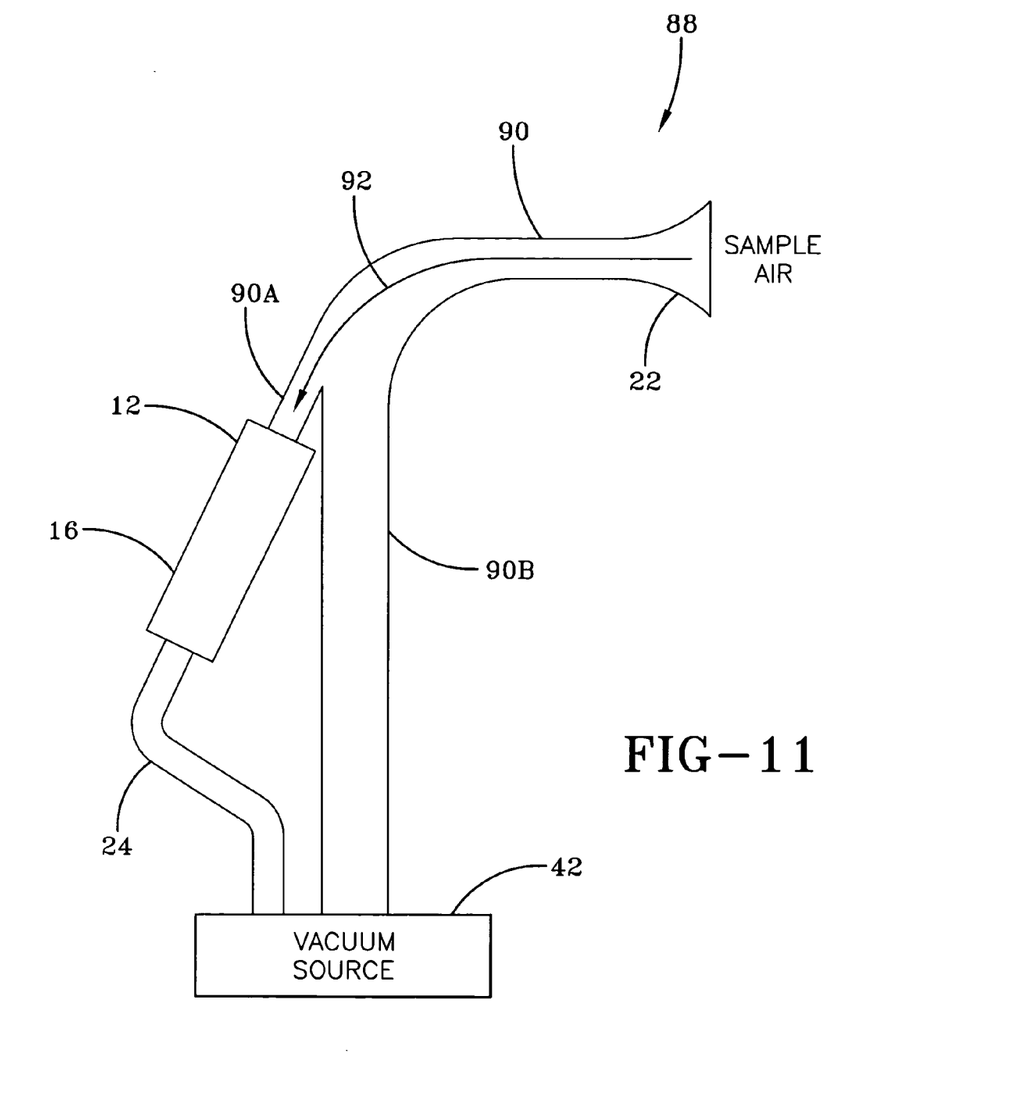
FIG. 11 illustrates an embodiment of the invention having a centrifugal separator to concentrate particles so as to handle relatively large volumes of air samples.
Figure 12:
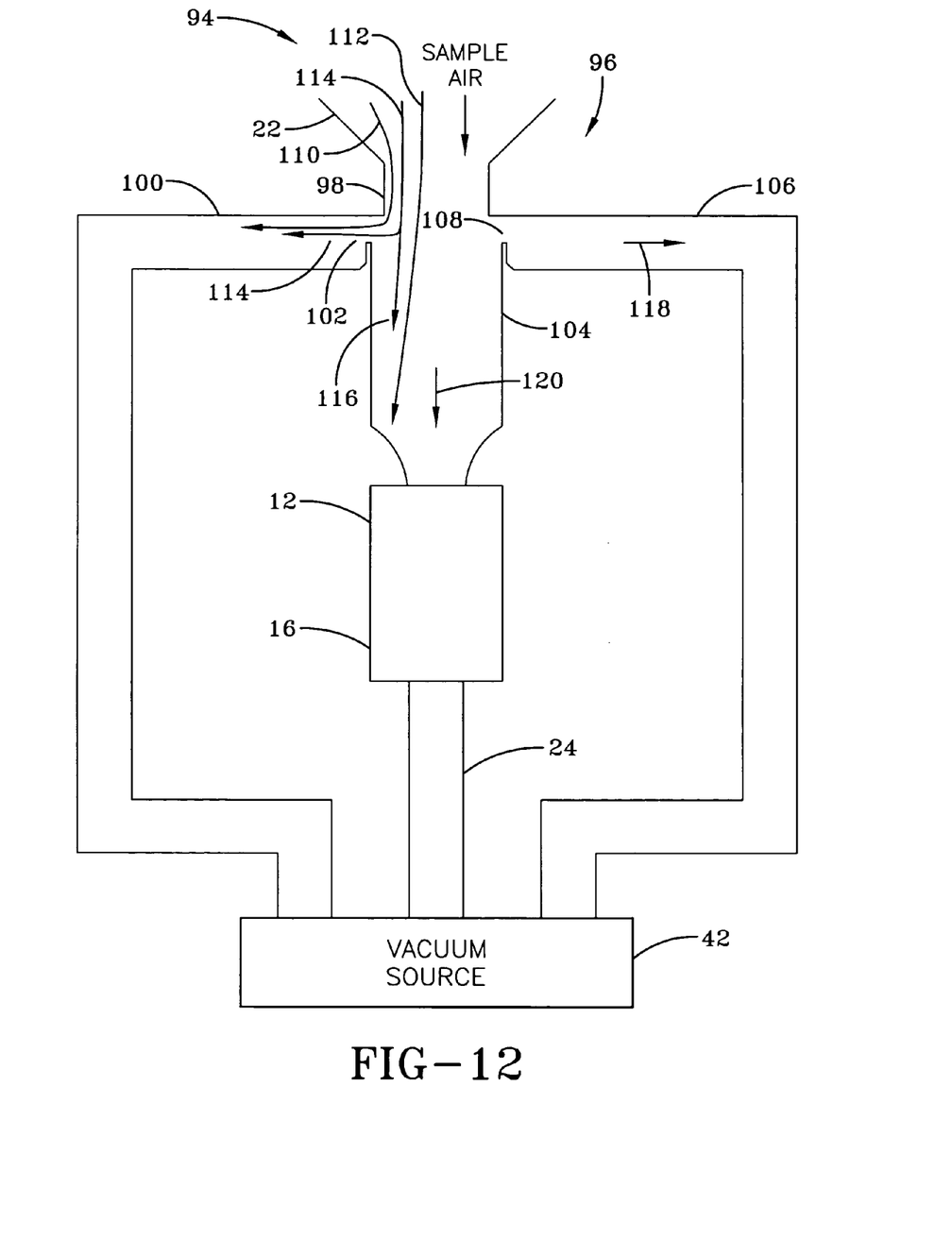
FIG. 12 illustrates another embodiment of the invention having a device for concentrating the particles being sampled so as to increase the volume of air capable of being sampled.

The volume of the air being sampled by a system of FIG. 1, may be increased by either of the embodiments shown in FIGS. 11 and 12. More particularly, the detector 16 of FIG. 1 enclosed in the microwave guide 12, may be used in conjunction with the embodiments of FIGS. 11 and 12 to concentrate the air particles or to separate the air particles from a larger volume thereof. This concentration or separation by either of the embodiments of FIGS. 11 and 12 allows the detector 16 to sample an increased amount of volume without aspirating all of the air through the cavity 26 associated with the detector 16, thereby reducing energy requirements.

Either of the embodiments of FIGS. 11 and 12 provides a conduit for receiving the airborne particles 20 being detected by detector 16. The conduit is dimensioned so as to direct the flow of the received particles into at least two paths, with the first path (minor flow) having a concentrated amount of received particles and being in fluid communication with the input of the microwave guide 12 forming part of the means for directing the airborne particles 20. The second path (major flow) carries the remainder of the received particles and is in fluid communication with a vacuum source, such as vacuum source 42.

More particularly, with reference to FIG. 11, there is shown an arrangement 88 having a conduit 90 serving as a device that concentrates particles of the sampled air entering the sampling nozzle 22. The concentrating device 90 has two chambers 90A and 90B. Chamber 90A provides a means for creating a first path 92, which defines the trajectory at which the air particles 20 to be sampled are delivered to the detector 16. This first path 92 corresponds to the centrifugal direction of the air particles 20 being received by the conduit 90. The air particles 20 flowing along path 92 are directed into the microwave guide 12 for detection by detector 16 in a manner as previously described. The microwave guide 12 also provides the fluid conduit 24, previously discussed with reference to FIG. 1, which is connected to the vacuum source 42. The chamber 90B of the concentrating device 90 carries the major flow and the remainder of the airborne particles not present in the trajectory path 92 to vacuum source 42.

With reference to FIG. 12, there is shown an arrangement 94 that includes a concentrating device 96 for increasing the volume of the air capable of being handled by the system 10. The concentrator 96 comprises an acceleration nozzle 98 connected to the sampling nozzle 22 and having an input with an inner diameter and having a length. The output of the acceleration nozzle 98 is fed into a first probe tube 100 by way of opening 102, into a second probe tube 104 having an inner diameter, and then into a third probe tube 106 by way of its input 108.

The performance characteristics of the concentrator 96 is selected, in accordance to establish aerosol sampling practices in a manner known in the art, to meet the desired particle size cutoff of the particles desired to be detected and to meet the minor flow needs of the detector 10 of the present invention.

The nozzle 98 is dimensioned, in a manner known in the art, so as to provide at least first and second streamlines 110 and 112, shown in FIG. 12, with the first streamline defining a path line for the trajectory of airborne particles 20 having a size smaller than the size of an airborne particles desired to be detected, and with the second streamline 112 defining a path line for the trajectory of airborne particles 20 having a size equal to or greater than the size of airborne particles 20 desired to be detected.

The first probe tube 100 is arranged to receive the particles associated with the streamline 110. The air particles 20 associated with the streamline 110 are representative of particles too small to be collected and have a path defined by the phantom line of trajectory 114, shown in FIG. 12.

The second probe tube 104 is arranged to receive the airborne particles 20 associated with the second streamline 112 having a trajectory 116 (shown in phantom). The second probe tube 104 is in fluid communication with the input of the microwave-guide 12 serving as part of the means for directing airborne particles 20 previously discussed with reference to FIG. 1. The particles entering the micro-waveguide 12 are detected by detector 16 and are carried to the vacuum source 24 by way of the fluid conduit 24.

The output of the first 100 and third 106 probe tubes are in fluid communications with the vacuum source 42, as shown in FIG. 2. The first probe tube 100 and the third probe tube 106 carry the major portion of the air being sampled by system 10 and is indicated by directional arrow 118, whereas the second probe tube 104 carries the sampled air having the desired size and flowing in a direction 120 represented by a directional arrow and indicative of the mirror flow of the major flow 118. The minor flow is meant to represent a flow consistent with the flow characteristics of the detector 10.

It will be understood that various changes and details, steps and arrangement of parts and method steps, which have been described and illustrated in order to explain the nature of the invention, may be made by those skilled in the art within the principle and scope of the invention as expressed in the appended claims.

We claim:

1. A device for detecting airborne conductive or dielectric particles, comprising:
- a resonant cavity having a high E field sensing region;
- means for feeding power to the cavity;
- a suction device for directing an airborne particle through the high E field sensing region of the cavity;
- sensing means coupled to the cavity for sensing a drop in E field level caused by the particle and outputting an output signal representative thereof; and
- means for displaying a histogram of the effective conductivity of airborne conductive particles comprising:
- means for measuring the height of each signal outputted by the sensing means per unit time;
- means for counting the number of signals of a given height as a count that is output by the sensing means per unit time;
- a memory storage register having an address number proportional to signal height;
- means for storing the count in the memory storage register at the respective address number; and
- means for displaying the count from each address number of the memory storage register as a function of address number.

2. The device according to claim 1, wherein said output signal is proportional to the volume concentration of said airborne conductive particles.

3. The device according to claim 1, further comprising means for measuring the volume concentration of conductive articles comprising:
- means for measuring the air volume flow rate through the high E field sensing region of the cavity; and
- means for counting the number of signals outputted by the sensing means per unit time.

4. The device according to claim 1, further comprising means for measuring the mass flow rate of airborne conductive articles comprising:
  means for measuring the volume of air flowing through the high E field sensing region of the cavity per unit time; and
  means for measuring the average height of the signals outputted by the sensing means per unit time.

5. The device according to claim 4, further comprising means for displaying the count of signals outputted by said sensing means.

6. The device of claim 1, wherein the suction device is operable to direct an aerosol distribution of the airborne conductive or dielectric particles, including the airborne particle.

7. A device for detecting airborne conductive or dielectric particles, comprising:
  a resonant cavity having a height greater than a width and having a high E field sensing region;
  means for feeding power to the cavity;
  a suction device for directing an airborne particle through the high E field sensing region of the cavity;
  sensing means coupled to the cavity for sensing a drop in E field level caused by the particle and outputting a signal representative thereof; and
  means for displaying a histogram of the effective conductivity of airborne conductive particles comprising:
    means for measuring the height of each signal outputted by the sensing means per unit time;
    means for counting the number of signals of a given height as a count that is output by the sensing means per unit time;
    a memory storage register having an address number proportional to signal height;
    means for storing the count in the memory storage register at the respective address number; and
    means for displaying the count from each address number of the memory storage register as a function of address number.

8. The device according to claim 7, wherein said cavity has a resonant frequency and wherein said means for feeding power supplies an excitation frequency slightly higher than said resonant frequency.

9. The device of claim 7, wherein the suction device is operable to direct an aerosol distribution of the airborne conductive or dielectric particles, including the airborne particle.

10. An arrangement for detecting the x, y, and z components of airborne conductive particles, comprising:
  first and second wave guides having a first cavity and a second cavity, respectively, each with a high E field sensing region, and a third cavity with a high E field sensing region, said three E field sensing regions being orthogonally arranged relative to each other so that x, y, and z sensing fields are provided;
  means for feeding power to said three cavities;
  means for directing an airborne particle through the high E field sensing region of the cavity of the x sensing field; and
  sensing means coupled to each of the three cavities for sensing the drop in E field level caused by the particle and outputting a signal representative thereof.

11. An arrangement for detecting the x, y, and z components of airborne conductive particles, comprising:
  a resonant cavity with an input port and an opening near said input port and having a high E field sensing region;
  means for feeding power to the cavity;
  a suction device for directing an airborne particle into said input port of the resonant cavity and through the high E field sensing region of the cavity;
  sensing means coupled to the cavity for sensing a drop in E field level caused by the particle and outputting a signal representative thereof; and
  means for displaying a histogram of the effective conductivity of airborne conductive particles comprising:
    means for measuring the height of each signal outputted by the sensing means per unit time;
    means for counting the number of signals of a given height as a count that is output by the sensing means per unit time;
    a memory storage register having an address number proportional to signal height;
    means for storing the count in the memory storage register at the respective address number; and
    means for displaying the count from each address number of the memory storage register as a function of address number.

12. The arrangement of claim 11, wherein the suction device is operable to direct an aerosol distribution of the airborne conductive particles, including the airborne particle.

13. A method for detecting airborne conductive or dielectric particles, comprising the steps of:
  providing a resonant cavity having a high E field sensing region;
  feeding power to the cavity;
  directing an airborne particle through the high E field sensing region of the cavity using a suction device;
  sensing a drop in E field level caused by the particle and for outputting an output signal representative thereof; and
  displaying a histogram of the effective conductivity of airborne conductive particles comprising:
    measuring the height of each signal outputted by the sensing means per unit time;
    counting the number of signals of a given height outputted by the sensing means per unit time;
    providing a memory storage register having an address number proportional to signal height;
    storing the count in the memory storage register at the respective address number; and
    displaying the count from each address number of the memory storage register as a function of address number.

14. The method of claim 13, wherein directing an airborne particle comprises directing an aerosol distribution of the airborne conductive or dielectric particles, including the airborne particle, through the high E field sensing region of the cavity using the suction device.

15. The method according to claim 13, wherein said cavity has a resonant frequency and wherein said feeding power supplies an excitation frequency slightly higher than the resonant frequency.

16. The method according to claim 13, wherein said output signal is proportional to the volume concentration of said airborne conductive particles.

17. The method according to claim 13, further comprising providing means for measuring the volume concentration of conductive particles comprising:
  providing means for measuring the air volume flow rate through the high E field sensing region of the cavity; and
  providing means for counting the number of signals outputted by the sensing means per unit time.

18. The method according to claim 17, further comprising providing means for displaying the count of signal outputted by said sensing means.

19. The method according to claim 13, further comprising providing
means for measuring the mass flow rates of airborne conductive particles comprising:
measuring the volume of air flowing through the high E field sensing region of the cavity per unit time; and
measuring the average height of the signals outputted by the sensing means per unit time.

20. A method for detecting airborne conductive particles, comprising:
providing a resonant cavity having dimension wherein its height is greater than its width and having a high E field sensing region;
feeding power to the cavity;
directing an airborne particle through the high E field sensing region of the cavity using a suction device;
providing sensing means coupled to the cavity for sensing a drop in E field level caused by the particle and for outputting a signal representative thereof; and
displaying a histogram of the effective conductivity of airborne conductive particles comprising:
measuring the height of each signal outputted by the sensing means per unit time;
counting the number of signals of a given height outputted by the sensing means per unit time;
providing a memory storage register having an address number proportional to signal height;
storing the count in the memory storage register at the respective address number; and
displaying the count from each address number of the memory storage register as a function of address number.

21. The method of claim 20, wherein directing an airborne particle comprises directing an aerosol distribution of the airborne conductive or dielectric particles, including the airborne particle, through the high E field sensing region of the cavity using the suction device.

22. The method according to claim 20, wherein said cavity has a resonant frequency and wherein said power supplied to said cavity is at an excitation frequency slightly higher than said resonant frequency.

* * * * *